United States Patent
Wu et al.

(10) Patent No.: US 9,312,284 B2
(45) Date of Patent: Apr. 12, 2016

(54) ACTIVE DEVICE ARRAY SUBSTRATE

(71) Applicant: E Ink Holdings Inc., Hsinchu (TW)

(72) Inventors: Chi-Ming Wu, Hsinchu (TW); Wei-Te Huang, Hsinchu (TW); Chun-Wei Hsieh, Hsinchu (TW); Shu-Ping Yan, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/301,346

(22) Filed: Jun. 11, 2014

(65) Prior Publication Data

US 2015/0129880 A1 May 14, 2015

(30) Foreign Application Priority Data

Nov. 12, 2013 (TW) .............................. 102141090 A (51) Int. Cl.
*G02F 1/167* (2006.01)
*H01L 27/12* (2006.01)
*G09G 3/34* (2006.01)
(Continued)

(52) U.S. Cl.
CPC ........ *H01L 27/124* (2013.01); *G02F 1/134309* (2013.01); *G02F 1/134336* (2013.01); *G02F 2001/13456* (2013.01); *G09G 3/344* (2013.01); *G09G 2300/0426* (2013.01)

(58) Field of Classification Search
CPC .............. H01L 27/124; H01L 27/1244; G02F 1/13306; G02F 1/134309; G02F 1/1345; G02F 1/134336; G02F 2001/13456; G09G 3/3622; G09G 2300/0426
USPC ................ 257/59, 72; 345/103, 204, 205, 84, 345/98–100
See application file for complete search history.

(56) References Cited

U.S. PATENT DOCUMENTS

| 5,270,693 A | 12/1993 | Wyler et al. |
| 6,448,953 B1 * | 9/2002 | Murade ................ G09G 3/3688 345/100 |
| 6,507,332 B1 * | 1/2003 | Kuwabara ............ G09G 3/3688 345/103 |

(Continued)

FOREIGN PATENT DOCUMENTS

| CN | 101191929 | 6/2008 |
| CN | 101673020 | 3/2010 |

OTHER PUBLICATIONS

Machine translation, Taiwanese Office Action in TW 102139596, translation date: Nov. 9, 2015, Google translate, all pages.*

(Continued)

*Primary Examiner* — Victoria K Hall
(74) *Attorney, Agent, or Firm* — Jianq Chyun IP Office (57) ABSTRACT

An active device array substrate includes a substrate, first signal lines, second signal lines, pixel units, selection units, an insulating layer, and a driving unit. The second signal lines and the selection lines are electrically connected with the driving unit. The insulating layer is disposed among the first signal lines, the second signal lines and the selection lines and has contact holes. The contact holes are disposed corresponding to the first signal lines, and a portion of the selection lines are electrically connected with the first signal lines via the contact holes. The selection line corresponding to the contact hole the farthest from the driving unit and the closest to a reference axis of the substrate and the selection line corresponding to the contact hole the closest to the driving unit and the reference axis respectively receive a start signal and a terminal signal provided by the driving unit.

11 Claims, 7 Drawing Sheets

(51) Int. Cl.
*G02F 1/1343* (2006.01)
*G02F 1/1345* (2006.01)

(56) References Cited

U.S. PATENT DOCUMENTS

| | | | |
|---|---|---|---|
| 6,522,317 B1* | 2/2003 | Satou | G09G 3/3688 345/100 |
| 6,618,043 B2 | 9/2003 | Washio et al. | |
| 7,095,475 B2* | 8/2006 | Shih | G02F 1/136286 345/103 |
| 8,023,087 B2 | 9/2011 | Yamamoto et al. | |
| 8,139,194 B2 | 3/2012 | Yamamoto et al. | |
| 8,736,544 B2* | 5/2014 | Shimoshikiryoh | G09G 3/3614 345/103 |
| 8,743,047 B2* | 6/2014 | Kawabata | G09G 3/3666 345/103 |
| 8,772,780 B2* | 7/2014 | Huang et al. | 257/59 |
| 8,878,760 B2* | 11/2014 | Kawabata | G09G 3/3614 345/103 |
| 9,097,921 B2* | 8/2015 | Ogasawara | G02F 1/13452 |
| 2002/0140664 A1* | 10/2002 | Enomoto | G09G 3/3648 345/103 |
| 2005/0073474 A1 | 4/2005 | Kim et al. | |
| 2005/0140642 A1* | 6/2005 | Chiu | G02F 1/1345 345/103 |
| 2005/0225690 A1 | 10/2005 | Battersby | |
| 2005/0264511 A1* | 12/2005 | Takaki | G09G 3/20 345/98 |
| 2005/0270266 A1* | 12/2005 | Lin | G09G 3/3666 345/103 |
| 2006/0077191 A1 | 4/2006 | Ming-Daw et al. | |
| 2008/0266210 A1* | 10/2008 | Nonaka | G09G 3/20 345/55 |
| 2009/0257016 A1 | 10/2009 | Ito et al. | |
| 2010/0141570 A1 | 6/2010 | Horiuchi et al. | |
| 2010/0156954 A1 | 6/2010 | Kim et al. | |
| 2010/0289994 A1 | 11/2010 | Nonaka | |
| 2010/0328292 A1* | 12/2010 | Akiyama et al. | 345/211 |
| 2011/0007045 A1* | 1/2011 | Bayrle | G02F 1/1345 345/205 |
| 2011/0090205 A1* | 4/2011 | Ito | G02F 1/133305 345/211 |
| 2011/0127536 A1* | 6/2011 | Yoshida et al. | 257/59 |
| 2012/0057091 A1* | 3/2012 | Kawabata | G02F 1/13439 349/38 |
| 2012/0104419 A1* | 5/2012 | Liao | G02F 1/133351 257/88 |
| 2013/0168707 A1* | 7/2013 | Huang et al. | 257/88 |
| 2013/0229587 A1* | 9/2013 | Takama | G02B 27/22 349/33 |
| 2013/0235279 A1* | 9/2013 | Sugisaka | G02F 1/1345 348/739 |
| 2014/0043306 A1* | 2/2014 | Min | G09G 3/3685 345/204 |
| 2015/0206470 A1* | 7/2015 | Wu et al. | 345/103 |
| 2015/0214246 A1* | 7/2015 | Wu et al. | 257/347 |

OTHER PUBLICATIONS

"Office Action of Taiwan Counterpart Application", issued on Sep. 11, 2015, p. 1-p. 6, in which the listed references were cited.

* cited by examiner

ACTIVE DEVICE ARRAY SUBSTRATE

CROSS-REFERENCE TO RELATED APPLICATION

This application claims the priority benefit of Taiwan application serial no. 102141090, filed on Nov. 12, 2013. The entirety of the above-mentioned patent application is hereby incorporated by reference herein and made a part of this specification.

BACKGROUND OF THE INVENTION

1. Field of the Invention

The invention relates to a substrate, and more particularly to an active device array substrate.

2. Description of Related Art

With the spread of information products and development in technology, it has always been a primary goal to produce a display characterized in being light, thin, and flexible. An electrophoresis display is one of the displays that catch a lot of attention. Currently, a commonly seen electrophoresis display is assembled by an electrophoresis display film and an active device array substrate. The electrophoresis display film has an electrophoresis display material including a display solution and a plurality of display particles spreading in the display solution. When the active device array substrate drives the display particles, the display particles move up (a direction toward a reader) or down (a direction away from the reader). When an external light source is reflected by the display particles, the reader may observe the color of the display particles or the display solution so as to obtain a corresponding display image.

Generally speaking, the signals of the active device array substrate are transmitted thorough the conductive wires disposed at a border edge outside the display area. Accordingly, the border edge of the active device array substrate has to have sufficient space for the arrangement of the conductive wires. However, as the demand for higher resolution grows, the number of conductive wires also increases. Consequently, the active device array substrate needs more space for the conductive wires to be configured therein, which would inevitably restrain the design of the display products from being light, thin, short and compact.

SUMMARY OF THE INVENTION

The invention provides an active device array substrate which has a slim border and allows a display panel to have a good display quality.

In the invention, the active device array substrate includes a substrate, a plurality of first signal lines, a plurality of second signal lines, a plurality of pixel units, a plurality of selection lines, an insulating layer, and a driving unit. The substrate has a reference axis, an active area and a periphery area located around the active area. The reference axis divides the active area into a first region and a second region. The first signal lines are disposed in the active area of the substrate. The second signal lines are disposed on the substrate and interlace with the first signal lines. The pixel units are disposed within the active area and electrically connected to the corresponding first signal lines and the corresponding second signal lines. The selection lines are disposed on the substrate and extend from the active area to the periphery area along with the second signal lines. The insulating layer is disposed among the first signal lines, the second signal lines, and the selection lines and has a plurality of contact holes. The contact holes are disposed corresponding to the first signal lines, and a portion of the selection lines is electrically connected to the first signal lines respectively via the contact holes. The contact holes are divided into a plurality of first contact holes located within the first region and a plurality of second contact holes located within the second region. The driving unit is disposed on the substrate and located in the periphery area, wherein the second signal lines and a portion of the selection lines are electrically connected to the driving unit. Orthogonal projection positions of the first contact holes formed on the substrate are disposed in a direction the farthest from the driving unit and the closest to the reference axis toward a direction close to the driving unit and distant from the reference axis. Orthogonal projection positions of the second contact holes formed on the substrate are disposed in a direction the closest to the driving unit and the reference axis toward a direction distant away from the driving unit and the reference axis. The selection line corresponding to the first contact hole the farthest from the driving unit and the closest to the reference axis and the selection line corresponding to the second contact holes the closest to the driving unit and the reference axis respectively receive a start signal and a terminal signal provided by the driving unit.

In an embodiment of the invention, one of each of the first signal lines and each of the second signal lines is a scan line, and the other one of each of the first signal lines and each of the second signal lines is a data line.

In an embodiment of the invention, the driving unit includes at least one first driving unit and a plurality of second driving units. The first driving unit is located between the second driving units.

In an embodiment of the invention, one of the first driving unit and each of the second driving units is a gate driving unit, and the other one of the first driving unit and each of the second driving units is a source driving unit.

In an embodiment of the invention, the at least first driving unit is a plurality of first driving units; the first driving unit and the second driving units are disposed alternately.

In an embodiment of the invention, the second signal lines are electrically connected to the first driving unit, and the selection lines are electrically connected to the second driving units.

In an embodiment of the invention, a shape of the active area includes a circle shape, an oval shape, a regular pentagon shape, or a rectangular shape having rounded corners.

In an embodiment of the invention, the selection lines and the second signal lines are arranged in parallel in the active area, and the selection lines and the second signal lines connected to the driving unit in the periphery area by non-interlacing with one another.

In an embodiment of the invention, each of the selection lines is located between two adjacent second signal lines, and a number of the pixel units in the longest column is equivalent to a number of the pixel units in the longest row.

In an embodiment of the invention, a connection line of orthogonal projection positions of the first contact holes and a connection line of the second contact holes formed on the substrate are two parallel lines.

In an embodiment of the invention, the selection lines include a plurality of first selection lines and a plurality of second selection lines. Each of the first selection lines and each of the second selection lines are located between two adjacent second signal lines. A number of the pixel units in the longest column is greater than a number of the pixel units in the longest row.

Based on the above, since the active device array substrate of the invention adopts a stacked wiring arrangement, allowing a portion of the selection lines to be electrically connected to the first signal lines via the contact holes so that the area required for wiring arrangement is reduced, the active device array substrate of the invention may have a slim border. In addition, since the start signal and the terminal signal of the driving signal are both provided to the selection lines corresponding to the contact holes adjacent to two sides of the reference axis of the substrate, the invention may transmit the scan signal via the design of the selection lines and the contact holes, such that the first signal lines within the active area can be turned on one by one, allowing the active device array substrate of the invention to have a good display quality.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF EMBODIMENTS

Figure 1:
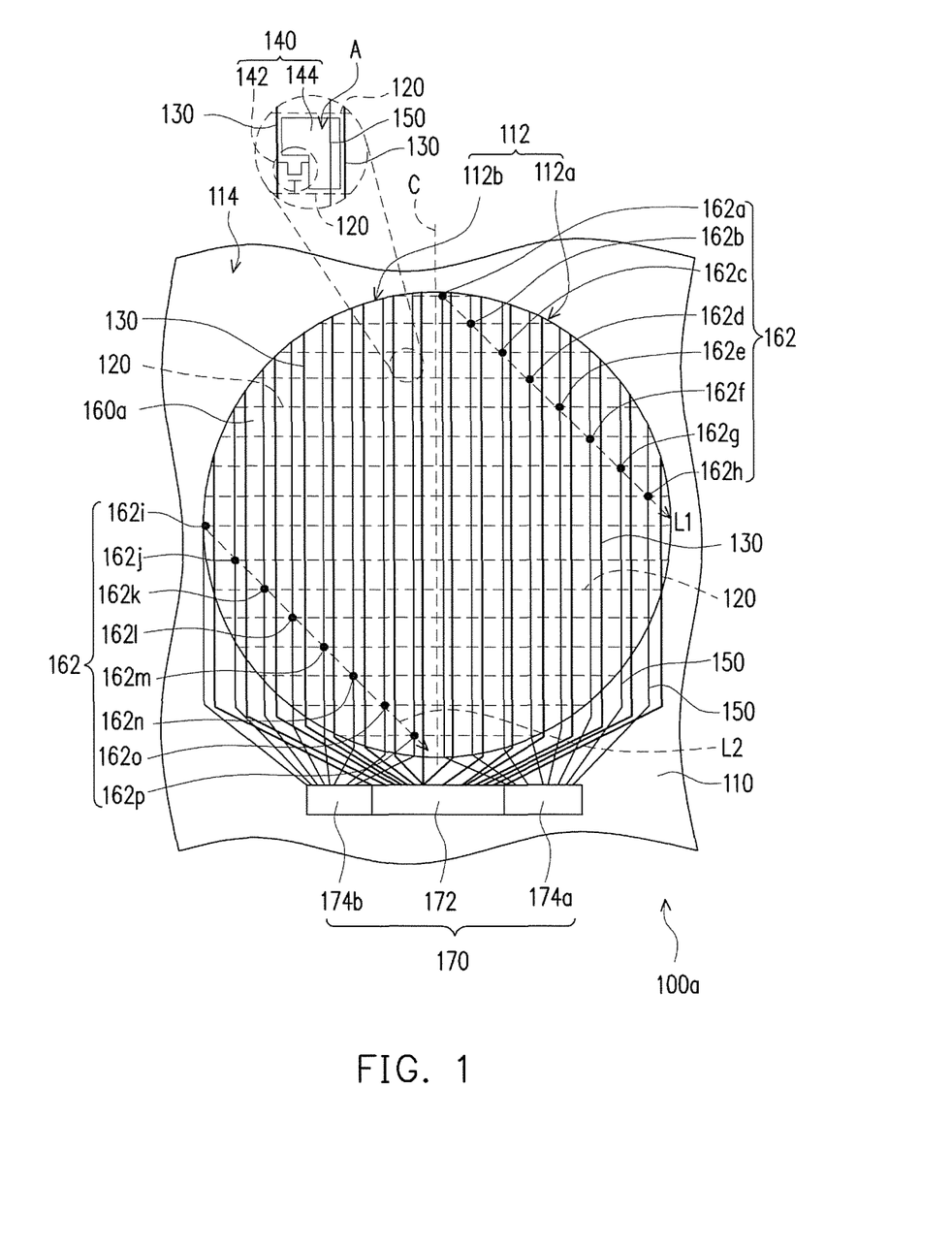
FIG. 1 is a schematic view illustrating an active device array substrate according to an embodiment of the invention.

FIG. 1 is a schematic view illustrating an active device array substrate according to an embodiment of the invention. Please refer to FIG. 1. In the embodiment, an active device array substrate 100a includes a substrate 110, a plurality of first signal lines 120, a plurality of second signal lines 130, a plurality of pixel units 140, a plurality of selection lines 150, an insulating layer 160a, and a driving unit 170. A substrate 110 has a reference axis C, an active area 112, and a periphery area 114 located around the active area 112, wherein the reference axis C divides the active area 112 into a first region 112a and a second region 112b. In an embodiment, it is defined that the reference axis C is a vertical line that goes from a highest position in the active area 112 toward the driving unit 170. The first signal lines 120 are disposed in the active area 112 of the substrate 110. The second signal lines 130 are disposed on the substrate 110 and interlace with the first signal lines 120. As shown in FIG. 1, the second signal lines 130 interlace with the first signal lines 120 vertically; however, the invention is not limited thereto. Meanwhile, the first signal lines 120 and the second signal lines 130 define a plurality of pixel regions A. The pixel units 140 are respectively disposed within the active area 112 and electrically connected to the corresponding first signal lines 120 and the second signal lines 130. Herein, the pixel units 140 are formed of an active device 142 and a pixel electrode 144 and located within the pixel region A; however, the invention is not limited thereto. The selection lines 150 are disposed on the substrate 110 and, along with the second signal lines 130, extend from the active area 112 to the periphery area 114.

The insulating layer 160a is disposed among the first signal lines 120, the second signal lines 130, and the selection lines 150 and has a plurality of contact holes 162. The contact holes 162 are respectively disposed corresponding to the first signal lines 120. Moreover, the selection lines 150 are electrically connected to the first signal lines 120 respectively via the contact holes 162. As shown in FIG. 1, the contact holes 162 may be divided into a plurality of first contact holes 162a~162h located within the first region 112a and a plurality of second contact holes 162i~162p located within the second region 112b. The driving unit 170 is disposed on the substrate 110 and located in the periphery area 114, wherein the second signal lines 130 and the selection lines 150 are electrically connected to the driving unit 170. Orthogonal projection positions of the first contact holes 162a~162h formed on the substrate 110 are disposed in a direction that is the farthest from the driving unit 170 and the closest to the reference axis C toward a direction that is close to the driving unit 170 and distant from the reference axis C. Orthogonal projection position of the second contact holes 162i~162p formed on the substrate 110 are disposed in a direction that is the closest to the driving unit 170 and the reference axis C toward a direction that is the farthest from the driving unit 170 and the reference axis C. In particular, the selection line 150 corresponding to the first contact hole 162a the farthest from the driving unit 170 and the closest to the reference axis C and the selection line 150 corresponding to the second contact hole 162p the closest to the driving unit 170 and the reference axis C respectively receive a start signal and a terminal signal provided by the driving unit 170.

As shown in FIG. 1, in the embodiment, a specific shape of the active area 112 of the substrate 110 is a circle shape, and the reference axis C is specifically a central axis of the circle. Certainly, in other embodiments that are not shown, a shape of the active area may also be a regular pentagon shape, an oval shape, or other suitable shapes. Preferably, the shape of the active area is a symmetrical shape having a reference axis, wherein the reference axis is not necessarily a central axis of the shape of the active area. In the meantime, the selection line 150 is located between two adjacent second signal lines 130; that is, there is only one selection line 150 between the adjacent second selection lines 130. In the pixel array defined alternately by the first signal lines 120 and the second signal lines 130, a number of the pixel units 140 in the longest column is substantially equivalent to a number of the pixel units 140 in the longest row. Each selection line 150 corresponds to one of the contact holes 162, and each selection line 150 is connected to the driving unit 170. Specifically, in the embodiment, a connection line of orthogonal projection positions of the first contact holes 162a~162h and a connection line of the second contact holes 162i~162p forming on the substrate 110 are two parallel lines L1, L2; however, the invention is not limited thereto. In addition, in the embodiment, the first signal lines 120 are specifically scan lines, and the second signal lines 130 are specifically data lines; however, the invention provides no limitation to the form of the first signal lines 120 and the second signal lines 130.

In the embodiment, the driving unit 170 specifically includes a first driving unit 172 and two second driving units 174a and 174b, wherein the first driving unit 172 is located between the second driving units 174a and 174b. As shown in FIG. 1, in the embodiment, the second signal lines 130 are electrically connected to the first driving unit 172, and the selection lines 150 are electrically connected to the second driving units 174a and 174b. It should be noted that, when the first signal lines 120 are scan lines and the second signal lines 130 are data lines, the first driving unit 172 is specifically a source driving unit, and the second driving units 174a and 174b are specifically gate driving units.

When the driving unit 170 provides a driving signal, a start signal provided by the second driving unit 174a is transmitted by the selection lines 150 from the first contact hole 162a to the first signal lines 120 the farthest from the driving unit 170. Thereafter, the second driving units 174b and 174a provide a signal to the selection lines 150 in sequence, and the selection lines 150 transmit the signal from the first contact holes 162b~462h and the second contact holes 162i~162o to the first signal lines 120. Finally, the terminal signal provided by the second driving unit 174b is transmitted by the selection lines 150 from the second contact hole 162p to the first signal line 150 the closest to the driving unit 170. It can be obtained that the driving signals provided by the second driving units 174a and 174b are in the same direction namely to the right. It should be noted that the direction is the same as the direction of the connection lines of the orthogonal projection positions of the first contact holes 162a~462h and the second contact holes 162i~162p formed on the substrate 110, namely two parallel lines L1 and L2 in a direction that goes from upper left to the lower right as shown in FIG. 1.

Figure 2:
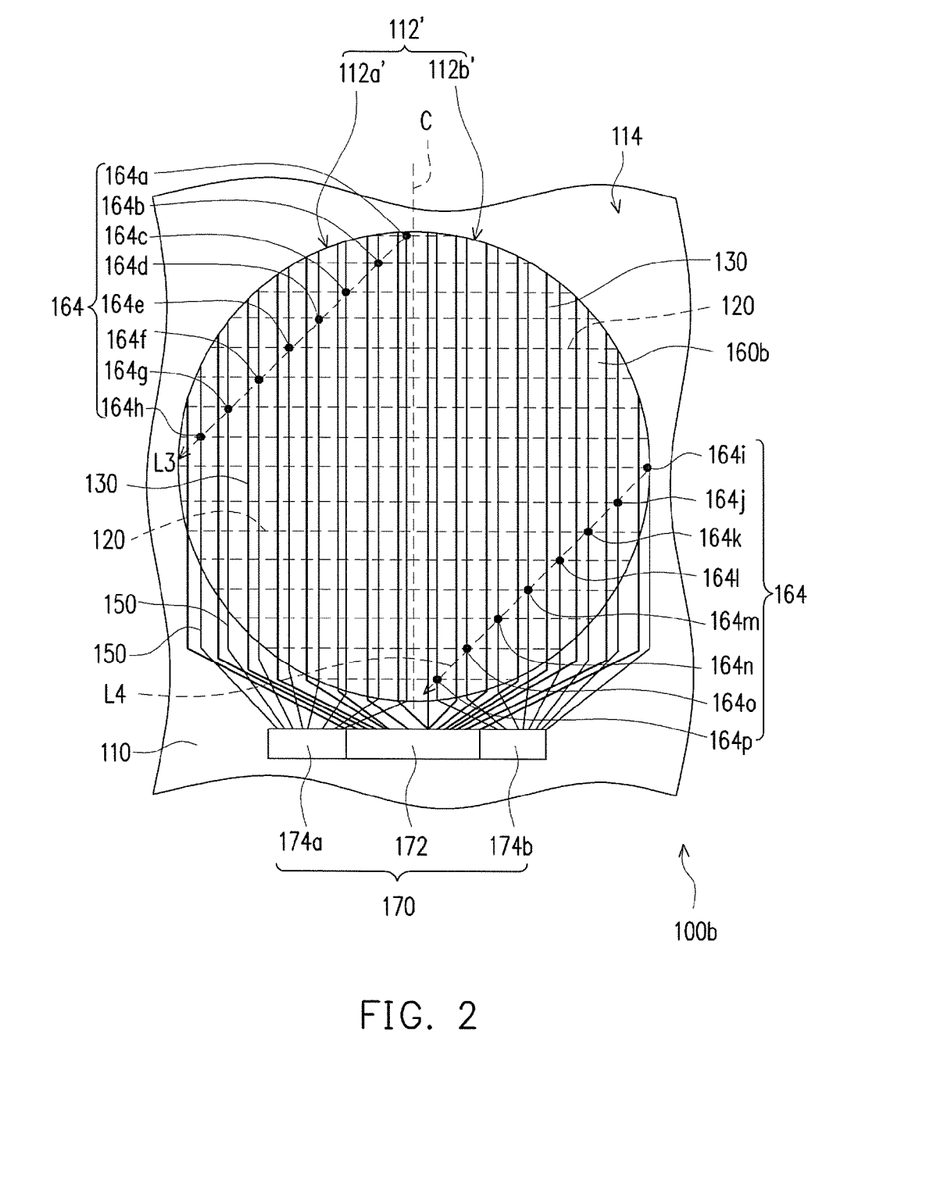
FIG. 2 is a schematic view illustrating an active device array substrate according to another embodiment of the invention.

Certainly, in other embodiments, please refer to FIG. 2, the first contact holes 164a~164h and the second contact holes 164i~464p of the contact holes 164 in the insulating layer 160b of the active device array substrate 100b are respectively located within a first region 112a' and the second region 112b' of the active area 112'. The connection lines of the orthogonal projection positions of the first contact holes 164a~164h and the second contact holes 164i~164p formed on the substrate 110 may be two parallel lines L3 and L4 in a direction that goes from the upper right to the lower left. Meanwhile, the driving direction of the driving unit 170 is in the same direction namely to the left, which still belongs to an adoptable technical solution for the invention and does not depart from the scope to be protected by the invention.

Since the active device array substrates 100a and 100b in the embodiment adopt the stacked type wiring arrangement, which enables the selection lines 150 to be electrically connected to the first signal lines 120 via the first contact holes 162a~162h, 164a~164h and the second contact holes 162i~162p, 164i~164p so that the area required for wiring arrangement can be reduced, the active device array substrates 100a and 100b in the embodiment may have a slim border. In addition, since the start signal provided by the second driving unit 174a and the terminal signal provided by the second driving unit 174b of the driving signal 170 in the embodiment are provided to the selection lines 150 corresponding to the first contact holes 162a, 164a and the second contact holes 162p, 164p adjacent to two sides of the reference axis C. The first signal line 120 the farthest from the driving unit 170 to the first signal line 120 the closest to the driving unit 170 may be turned on one by one according to the design of the contact holes 162a~162p and 164a~164p. Moreover, the driving direction of the driving unit 170 is in the same direction, that is, simultaneously to the left or to the right. Accordingly, the active device array substrates 100a and 100b in the embodiment have good display quality.

It should be noted that the following embodiments adopt the reference numbers and a part of the content described in the above embodiments, wherein the same references numbers are used for describing the same or similar devices, and the descriptions for the same technical content are omitted. Regarding the omitted description, please refer to the above embodiments for details; no further descriptions are incorporated in the following embodiments.

Figure 3:
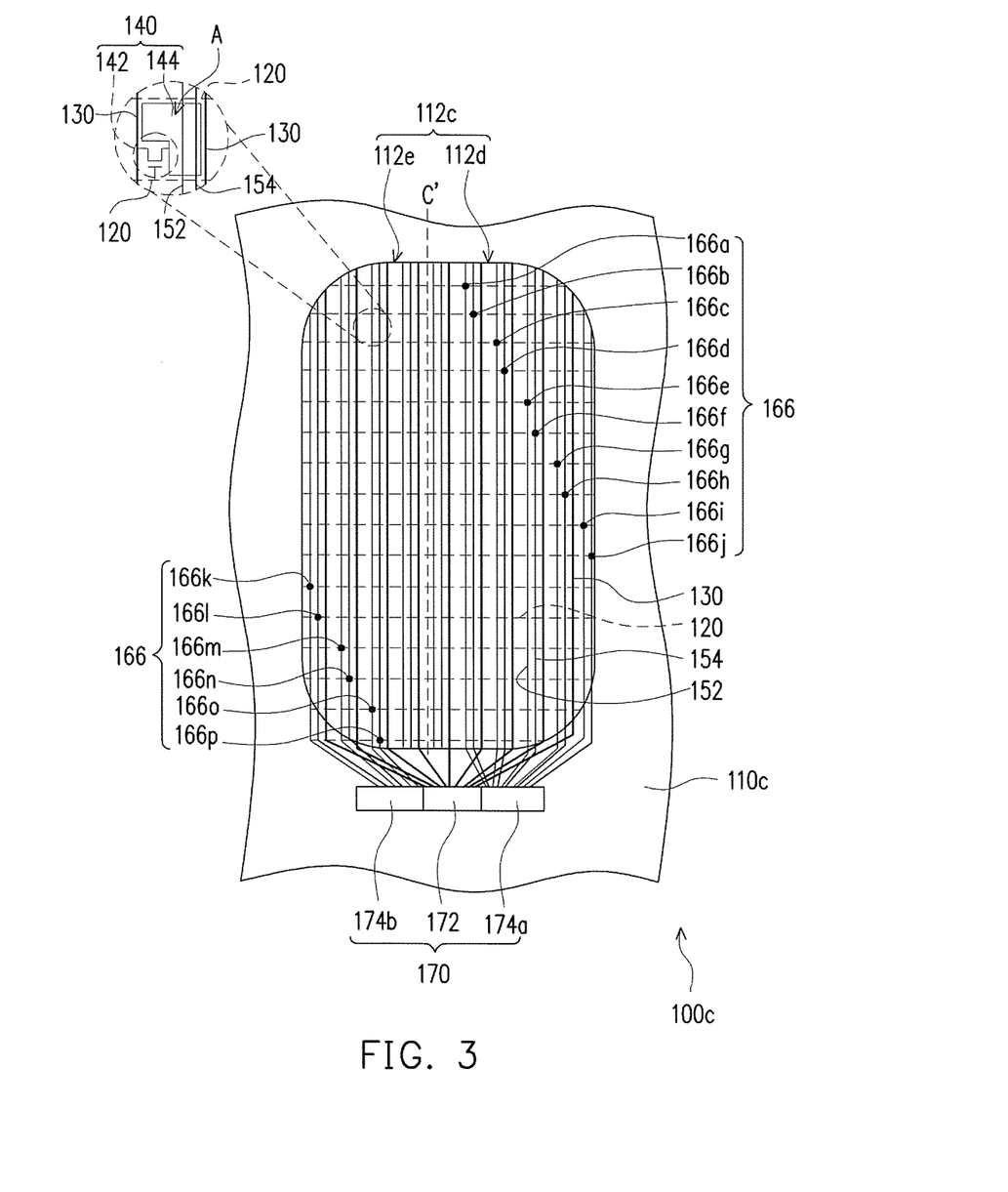
FIG. 3 is a schematic view illustrating an active device array substrate according to another embodiment of the invention.

FIG. 3 is a schematic view illustrating an active device array substrate according to another embodiment of the invention. Please refer to FIG. 3. In the embodiment, the active device array substrate 100c is similar to the active device array substrate 100a in FIG. 1. The major difference between the two substrates lies in that the specific outline of an active area 112c of the substrate 110c in the embodiment is a rectangular shape having rounded corners; the first contact holes 166a~166j and the second contact holes 166k~166p of the contact holes 166 are respectively located within a first region 112d and a second region 112e divided by a reference axis C'. Moreover, the selection line in the embodiment includes a plurality of first selection lines 152 and a plurality of second selection lines 154. Each of first selection lines 152 and each of the second selection lines 154 are located between two adjacent second signal lines 130, that is, there are one first selection line 152 and one second selection line 154 between two adjacent second selection lines 130. In the meantime, in the pixel array defined alternately by the first signal lines 120 and the second signal lines 130, a number of the pixel units 140 in the longest column is substantially greater than a number of the pixel units 140 in the longest row.

It should be noted that, in the embodiment, not each of the first selection lines 152 and each of the second selection lines 154 have the corresponding contact holes 166, only the first selection line 152 and the second selection line 154 connected to the driving unit 170 are provided with the contact holes 166 corresponding to the first signal line 120. As shown in FIG. 3, the first selection line 152 and the second selection line 154 close to the reference axis C' are not connected to the second driving units 174a and 174b. Furthermore, in the embodiment, the number of the first contact holes 166a~166j within the first region 112d is greater than the number of the second contact holes 166k~166p within the second region 112e. Specifically, the first selection line 152 corresponding to the first contact hole 166a the farthest from the driving unit 170 and the closest to the reference axis C' and the second selection line 154 corresponding to the second contact hole 166p the closest to the driving unit 170 and the reference axis C' respectively receive a start signal and a terminal signal provided by the second driving units 174a and 174b. Besides, orthogonal projections of the first selection line 152 and the second selection line 154 formed on the substrate 110c overlap with an orthogonal projection of the pixel electrode 144 of the pixel unit 140 formed on the substrate 110c; however, the invention is not limited thereto.

Figure 4:
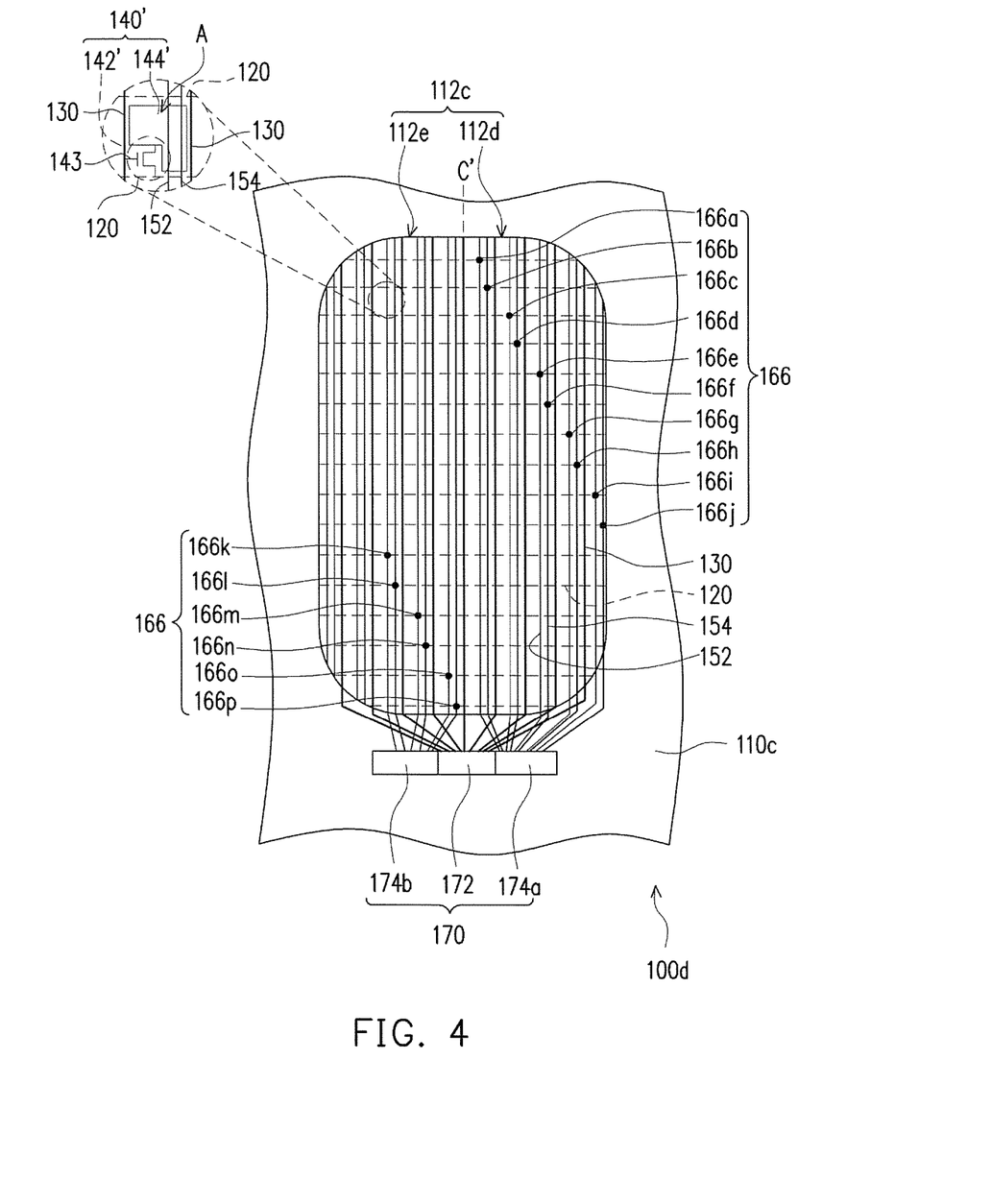
FIG. 4 is a schematic view illustrating an active device array substrate according to another embodiment of the invention.

FIG. 4 is a schematic view illustrating an active device array substrate according to another embodiment of the invention. Please refer to FIG. 4. In the embodiment, the active device array substrate 100d is similar to the active device array substrate 100c in FIG. 3; the major difference between the two substrates lies in that a gate 143 of an active device 142' of a pixel unit 140' in the embodiment is electrically connected to the second signal line 130; that is, the first signal line 120 is specifically a data line and the second signal line 130 is specifically a scan line. Meanwhile, orthogonal projections of the first selection line 152 and the second selection line 154 formed on the substrate 110c overlap with an orthogonal projection of the pixel electrode 144' of the pixel unit 140' formed on the substrate 110c; however, the invention is not limited thereto. Furthermore, the first driving unit 172 is specifically a gate driving unit, and the second driving units 174a and 174b are specifically source driving units. In other words, the forms of the first driving unit 172 and the second driving units 174a and 174b are adjusted according to the forms of the first signal line 120 and the second signal line 130. Apart from that, as shown in FIG. 4, a part of the first selection line 152 and a part of the second selection line 154 that are distant from the reference axis C' within the second region 112e are not connected to the second driving unit 174b.

Figure 5:
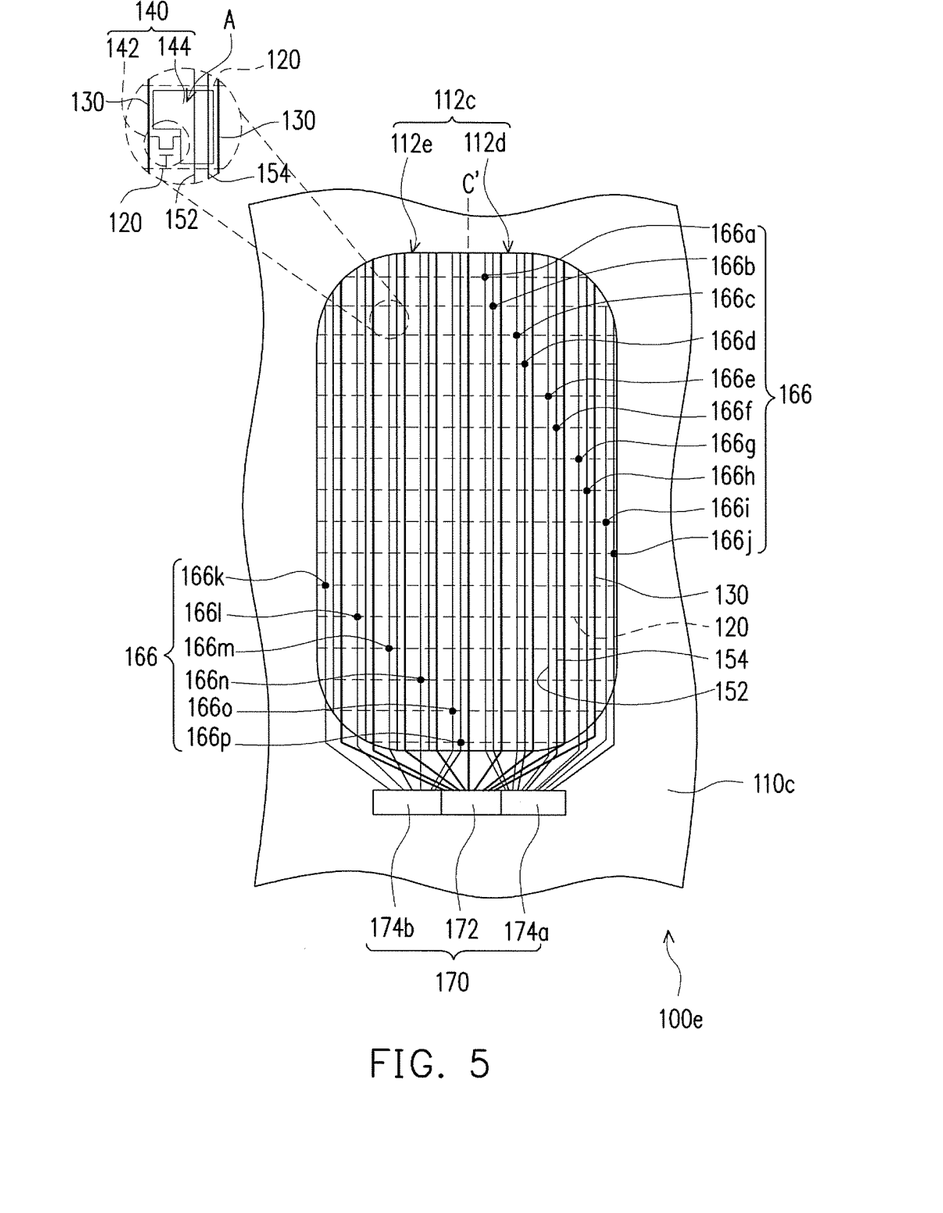
FIG. 5 is a schematic view illustrating an active device array substrate according to another embodiment of the invention.

FIG. 5 is a schematic view illustrating an active device array substrate according to another embodiment of the invention. Please refer to FIG. 5. The active device array substrate 100e in the embodiment is similar to the active device array substrate 100c in FIG. 3; the major difference between the two substrates lies in that only one of the second selection lines 154 within the second region 112e in the embodiment is connected to the second driving unit 174b, and only one of the first selection lines 152 within the second region 112e is not connected to the second driving unit 174b. That is to say, the second contact holes 166k~166o within the second region 112e are disposed corresponding to the first selection line 152, and only the second contact hole 166p is disposed corresponding to the second selection line 154.

Figure 6:
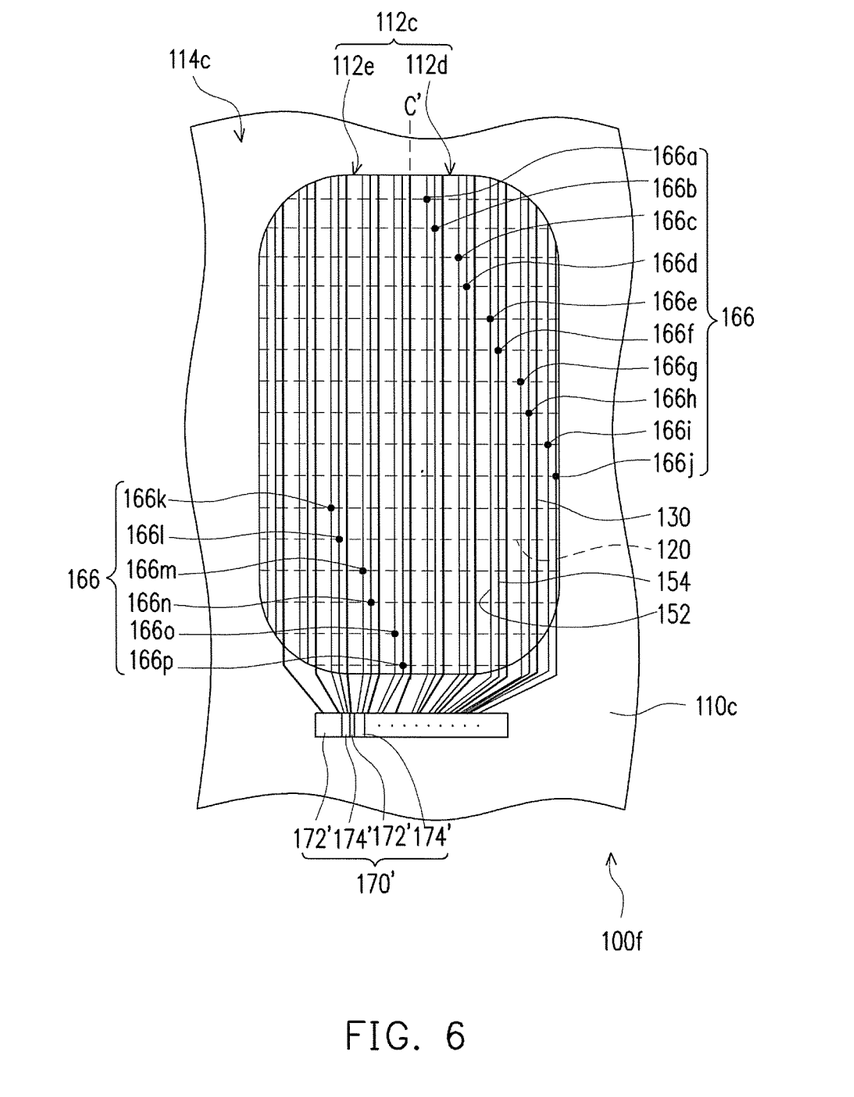
FIG. 6 is a schematic view illustrating an active device array substrate according to another embodiment of the invention.

FIG. 6 is a schematic view illustrating an active device array substrate according to another embodiment of the invention. Please refer to FIG. 6. The active device array substrate 100f in the embodiment is similar to the active device array substrate 100c in FIG. 3; the major difference between the two substrates lies in that the driving unit 170' in the embodiment is formed of a plurality of first driving units 172' and second driving units 174' disposed alternately, and therefore no interlacing wiring is required in the periphery area 114c of the substrate 110c.

Figure 7:
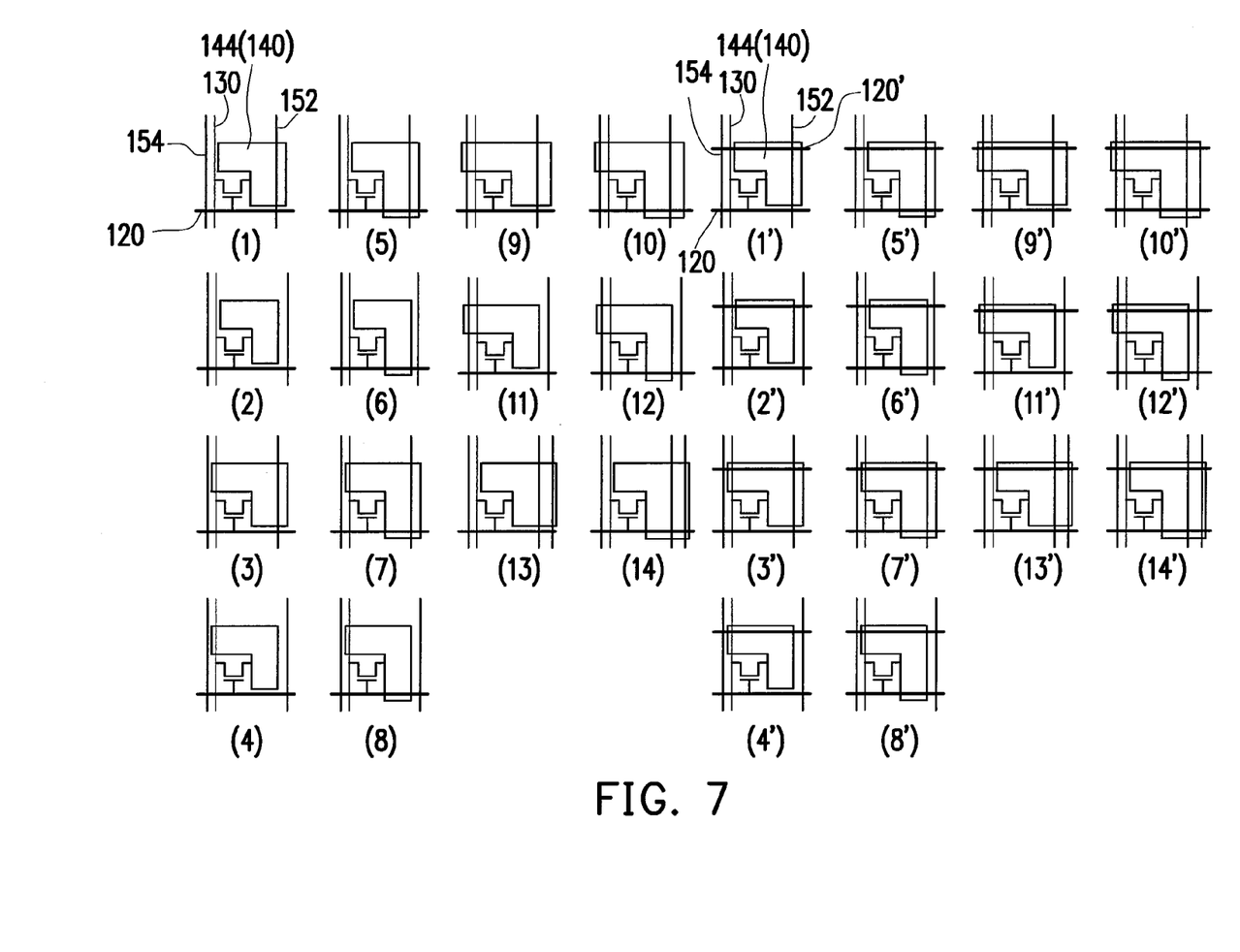
FIG. 7 is a schematic view illustrating a relative configuration among a first signal line, a second signal line, a first selection line, a second selection line, and a pixel electrode of a pixel unit according to a plurality of embodiments of the invention.

It should be pointed out that the invention provides no limitation to the forms that the first signal line 120, the second signal line 130, the first selection line 152 and the second selection line 154 overlap with the pixel electrodes 144 and 144' of the pixel units 140 and 140'. For example, please refer to FIG. 7, an orthogonal projection of the pixel electrode 144 of the pixel unit 140 formed on the substrate (please see the substrate 110c in FIG. 3) may partially overlap with an orthogonal projection of the first selection line 152 formed on the substrate as shown in sub FIG. 1); or may not overlap with orthogonal projections of the first selection line 152, the second selection line 154, the first signal line 120, and the second signal line 130 formed on the substrate as shown in sub FIG. 2); or may partially overlap with orthogonal projections of the first selection line 152 and the second signal line 130 formed on the substrate as shown in sub FIG. 3); or may partially overlap with an orthogonal projection of the second signal line 130 formed on the substrate as shown in sub FIG. 4); or may partially overlap with orthogonal projections of the first selection line 152 and the first signal line 120 formed on the substrate as shown in FIG. 5); or may partially overlap with an orthogonal projection of the first selection line 120 formed on the substrate as shown in sub FIG. (6); or may partially overlap with orthogonal projections of the first selection line 152, the first signal line 120, and the second signal line 130 formed on the substrate as shown in sub FIG. 7); or may partially overlap with orthogonal projections of the first signal line 120 and the second signal line 130 formed on the substrate as shown in sub FIG. 8); or may partially overlap with orthogonal projections of the first selection line 152, the second selection line 154, and the second signal line 130 formed on the substrate as shown in sub FIG. 9); or may partially overlap with orthogonal projections of the first selection line 152, the second selection line 154, the first signal line 120, and the second signal line 130 formed on the substrate as shown in sub FIG. 10); or may partially overlap with orthogonal projections of the second selection line 154 and the second signal line 130 formed on the substrate as shown in sub FIG. 11); or may partially overlap with orthogonal projections of the second selection line 154, the first signal line 120, and the second signal line 130 formed on the substrate as shown in sub FIG. 12); or may partially overlap with orthogonal projections of the first selection line 152 and the second selection line 154 formed on the substrate as shown in sub FIG. 13); or may partially overlap with orthogonal projections of the first selection line 152, the second selection line 154, and the first signal line 120 formed on the substrate as shown in sub FIG. 14). On the other hand, the difference between sub FIG. 1')~sub FIG. 14') and sub FIG. 1)~sub FIG. 14) merely lies in that an orthogonal projection of the pixel electrode 144 of the pixel unit 140 in sub FIG. 1')~sub FIG. 14') formed on the substrate (please see substrate 110c in FIG. 3) may further partially overlap with the first selection line 120' in another pixel region.

In addition, the invention does not provide limitation to that only one selection line 150 is provided between two adjacent second signal lines 130, or that only one first selection line 152 and one second selection line 154 are provided. In the embodiments that are not shown, when the first signal line 120 and the second signal line 130 interlace with each other and define the pixel array, and the number of the pixel units 140 in the longest column is greater than twice that of the pixel units 140 in the longest row, there may be three selection lines included between two adjacent second selection lines 130, which still belongs to an adoptable technical solution for the invention and does not depart from the scope to be protected by the invention.

Based on the above, since the active device array substrate of the invention adopts a stacked wiring arrangement, allowing the selection lines to be electrically connected to the first signal lines via the contact holes so that the area required for wiring arrangement is reduced, the active device array substrate of the invention may have a slim border. In addition, since the start signal and the terminal signal of the driving signal are both provided to the selection lines corresponding to the contact holes adjacent to two sides of the reference axis of the substrate, the invention may transmit the scan signal via the design of the selection lines and the contact holes, such that the first signal lines within the active area can be turned on one by one, allowing the active device array substrate of the invention to have a good display quality.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:
1. An active device array substrate, comprising:
a substrate having a reference axis, an active area, and a periphery area located around the active area, wherein the reference axis divides the active area into a first region and a second region;

a plurality of first signal lines disposed in the active area of the substrate;

a plurality of second signal lines disposed on the substrate and interlacing with the first signal lines;

a plurality of pixel units disposed within the active area and electrically connected to the corresponding first signal lines and the corresponding second signal lines;

a plurality of selection lines disposed on the substrate and extending from the active area to the periphery area along with the second signal lines;

an insulating layer disposed among the first signal lines, the second signal lines, and the selection lines and having a plurality of contact holes, the contact holes disposed corresponding to the first signal lines, and a portion of the selection lines electrically connected to the first signal lines respectively via the contact holes, wherein the contact holes are divided into a first plurality of contact holes located within the first region and a second plurality of contact holes located within the second region; and a driving unit disposed on the substrate and located in the periphery area, wherein the second signal lines and a portion of the selection lines are electrically connected to the driving unit, orthogonal projections of the first plurality of contact holes form a first line, the first line positioned diagonally with respect to the first signal lines, the second signal lines, and the selection lines, a first end point of the first line corresponding to a first contact hole of the first plurality of contact holes, the first contact hole being positioned closest to the reference axis and farthest from the driving unit of all contact holes of the first plurality of contact holes, and a second end point of the first line corresponding to a second contact hole of the first plurality of contact holes, the second contact hole being positioned farthest from the reference axis of all contact holes of the first plurality of contact holes, and closest to the driving unit of all contact holes of the first plurality of contact holes;

orthogonal projections of the second plurality of contact holes form a second line, the second line positioned diagonally with respect to the first signal lines, the second signal lines, and the selection lines, a first end point of the second line corresponding to a third contact hole of the second plurality of contact holes, the third contact hole being positioned closest to both the reference axis and the driving unit of all contact holes of the second plurality of contact holes, and a second end point of the second line corresponding to a fourth contact hole of the second plurality of contact holes, the fourth contact hole being positioned farthest from the reference axis of all contact holes of the second plurality of contact holes, and farthest from the driving unit of all contact holes of the second plurality of contact holes;

and the selection line corresponding to the first contact hole and the selection line corresponding to the third contact hole are configured, respectively, to receive a start signal and a terminal signal provided by the driving unit.

2. The active device array substrate as recited in claim 1, wherein one of each of the first signal lines and each of the second signal lines is a scan line, and the other one of each of the first signal lines and each of the second signal lines is a data line.

3. The active device array substrate as recited in claim 1, wherein the driving unit comprises at least one first driving unit and a plurality of second driving units, and the first driving unit is located between the second driving units.

4. The active device array substrate as recited in claim 3, wherein either:

(a) the first driving unit is a gate driving unit and each of the second driving units is a source driving unit; or (b) the first driving unit is a source driving unit and each of the second driving units is a gate driving unit.

5. The active device array substrate as recited in claim 3, wherein the at least one first driving unit is a plurality of first driving units, and the first driving units and the second driving units are disposed alternately.

6. The active device array substrate as recited in claim 3, wherein the second signal lines are electrically connected to the first driving unit, and the selection lines are electrically connected to the second driving units.

7. The active device array substrate as recited in claim 1, wherein a shape of the active area comprises a circle shape, an oval shape, a regular pentagon shape, or a rectangular shape having rounded corners.

8. The active device array substrate as recited in claim 1, wherein the selection lines and the second signal lines are arranged in parallel in the active area, and the selection lines and the second signal lines connected to the driving unit in the periphery area do not interlace with one another.

9. The active device array substrate as recited in claim 1, wherein each of the selection lines is located between the two adjacent second signal lines, and a number of the pixel units in a longest column of pixel units is equivalent to a number of pixel units in a longest row of pixel units.

10. The active device array substrate as recited in claim 9, wherein the first line and the second line are parallel lines.

11. The active device array substrate as recited in claim 1, wherein the selection lines comprise a plurality of first selection lines and a plurality of second selection lines, each of the first selection lines and each of the second selection lines are located between two adjacent second signal lines, and a number of pixel units in a longest column of pixel units is greater than a number of pixels in a longest row of pixel units.

* * * * *